United States Patent
Suzuki

(10) Patent No.: US 9,130,061 B2
(45) Date of Patent: Sep. 8, 2015

(54) SEMICONDUCTOR DEVICE

(75) Inventor: Hisamitsu Suzuki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 728 days.

(21) Appl. No.: 13/198,238

(22) Filed: Aug. 4, 2011

(65) Prior Publication Data

US 2012/0032273 A1    Feb. 9, 2012

(30) Foreign Application Priority Data

Aug. 5, 2010 (JP) ................. 2010-175991
Mar. 24, 2011 (JP) ................. 2011-066410

(51) Int. Cl.
*H01L 21/8238* (2006.01)

(52) U.S. Cl.
CPC .. *H01L 21/823871* (2013.01); *H01L 21/82385* (2013.01); *H01L 21/823814* (2013.01); *H01L 2924/0002* (2013.01)

(58) Field of Classification Search
USPC ......................................................... 257/369
See application file for complete search history.

(56) References Cited

U.S. PATENT DOCUMENTS

| 2001/0027008 | A1 | 10/2001 | Matsumoto | |
| 2005/0266636 | A1* | 12/2005 | Kitamura et al. | 438/241 |
| 2006/0289947 | A1* | 12/2006 | Yamanaka | 257/409 |
| 2007/0273012 | A1 | 11/2007 | Ikuta | |

FOREIGN PATENT DOCUMENTS

| JP | 3-180041 A | 8/1991 |
| JP | 6-333928 A | 12/1994 |
| JP | 2000-223492 A | 8/2000 |
| JP | 2001-217148 A | 8/2001 |
| JP | 2005-310902 A | 11/2005 |
| WO | WO 2006-061871 A1 | 6/2006 |

OTHER PUBLICATIONS

Koji Shirai et al., Ultra-Low On-Resistance LDMOS Implementation in 0.13 µm CD and BiCD Process Technologies for Analog Power IC's, ISPSD (21$^{st}$ International Symposium on Power Semiconductor Devices and ICs), 2009, pp. 77-79.

* cited by examiner

*Primary Examiner* — Fernando L Toledo
*Assistant Examiner* — Valerie N Newton
(74) *Attorney, Agent, or Firm* — Foley & Lardner LLP

(57) ABSTRACT

A semiconductor device includes: a micro CMOS region including a micro CMOS and a micro interconnect that is connected to the micro CMOS; and a high breakdown voltage device region including a high breakdown voltage device that has a breakdown voltage higher than that of the micro CMOS, and drain and source interconnects that are connected to the high breakdown voltage device and have a width greater than that of the micro interconnect in a plan view. In the high breakdown voltage device region, an electrically-isolated dummy interconnect is not provided adjacent to at least the drain interconnect and the source interconnect.

13 Claims, 8 Drawing Sheets

US 9,130,061 B2

SEMICONDUCTOR DEVICE

CROSS-REFERENCE TO RELATED APPLICATIONS

The disclosure of Japanese Patent Application No. 2010-175991 filed on Aug. 5, 2010 and Japanese Patent Application No. 2011-66410 filed on Mar. 24, 2011 including the specification, drawing and abstract are incorporated hereinto by reference.

BACKGROUND

The present invention relates to a semiconductor device.

A technique is known in which a dummy interconnect that is not connected to other interconnects is formed in a semiconductor device having multi-layer interconnects.

For example, Japanese Unexamined Patent Publication No. 2000-223492 discloses a structure in which dummy trench interconnects are arranged in a space around an interconnect isolation portion at the same pitch as that of a portion in which interconnects are densely arranged. In this way, it is possible to remove the difference of the interconnect density and it is possible to uniformly form the trench interconnects with the same dimensions as those of the mask. In addition, when interconnect metal is polished, it is possible to remove the difference between the heights of the interconnects due to the non-uniformity of the density of the interconnects.

Japanese Unexamined Patent Publication No. 03-180041 discloses a structure in which dummy interconnect layers that are not connected to other interconnect layers are arranged on an element isolation region of a peripheral circuit portion at the minimum pitch of the design rule. Therefore, a loading effect is less likely to occur, the dimensions of the interconnect layer do not vary depending on positions, and the characteristics of a transistor do not vary depending on positions.

Japanese Unexamined Patent Publication No. 06-333928 discloses a structure in which a dummy interconnect layer is provided and the amount of resist, which is a deposit supply source, is maintained to be equal to or more than a predetermined value during dry etching, which makes it possible to reduce a variation in the width of a line and a variation in the cross-sectional shape of the line in an LSI chip. In addition, the dummy interconnect layer is arranged at the position where the density of the pattern is low. In this way, it is possible to recover the flatness that has been lost due to the difference of the pattern density.

WO 2006/061871 discloses a structure in which a dummy metal plate with a high aspect ratio is provided in the same layer as that in which interconnects are formed to reduce thermal resistance without increasing the relative permittivity of an insulating layer, which makes it easy to move heat generated from the interconnect. In this way, it is possible to prevent an increase in temperature during the operation of a semiconductor device.

Japanese Unexamined Patent Publication No. 2001-217248 discloses a structure in which, when the density of the trench interconnects provided in an insulating film on a semiconductor substrate is not uniform, a dummy trench is provided in a region of the insulating film in which the density of the interconnects is low, thereby reducing dishing during a CMP process of the insulating film in the region in which the density of the interconnects low.

Japanese Unexamined Patent Publication No. 2005-310902 discloses a SiC power device in which some of a plurality of interconnects are connected to other interconnects by copper plugs.

ISPSD 2009 (21st International Symposium on Power Semiconductor Devices and ICs) p. 77-79 discloses the cross-sectional structure of an N-channel LDMOS. The structure of the LDMOS will be described in brief with reference to FIG. 7. A deep N-type well region which is called a DNW 902 and is formed by 2-MeV phosphor implantation is provided on a P-type silicon substrate 901. A body region, which is called a PW 906, of the LDMOS and a drain region including a drift 907 and an NW 908 are formed on the DNW 902. A gate electrode 903 is formed on the surface of the P-type silicon substrate 901. A drain interconnect 904 and a source interconnect 905 are formed on a silicon oxide film through contact plugs.

SUMMARY

The inventor has found that the following problems arose when the above-described techniques were applied to a semiconductor device including both a micro CMOS and a high breakdown voltage device.

In a CMOS forming region, dummy interconnect layers that are not connected to other interconnect layers are arranged at the minimum pitch of the design rule. For example, in Japanese Unexamined Patent Publication No. 2000-223492, the dummy pattern is arranged around the isolated interconnect portion in which there is no interconnect. As shown in FIG. 8, the dummy pattern is a rectangular pattern. The gap between the interconnects is in the range from the minimum pitch to a value that is 1.5 times more than the minimum pitch and the length of the interconnect in the longitudinal direction is two to three times more than the minimum width of the interconnect. For example, when the minimum pitch between the interconnects is 0.5 μm, the minimum dummy pattern is about 0.25 μm×0.5 μm.

However, the examination result of the inventor proved that, in a high breakdown voltage device forming region, when the dummy interconnect layers were arranged at the minimum pitch of the design rule, a high electric field was applied to the insulating film through the dummy interconnect which was adjacent to a drain interconnect or a source interconnect, which caused rapid deterioration of the insulating film, resulting in the occurrence of a short circuit between the interconnects through the dummy interconnect.

In one embodiment, there is provided a semiconductor device including: a first region including a first transistor and a first interconnect that is connected to the first transistor; and a second region including a second transistor that has a breakdown voltage higher than that of the first transistor and a second interconnect that is connected to the second transistor and has a width greater than that of the first interconnect in a plan view, wherein an electrically-isolated dummy interconnect is not provided adjacent to at least the second interconnect in the second region.

In another embodiment, there is provided a semiconductor device including: a first region including a first transistor and a first interconnect that is connected to the first transistor; a second region including a second transistor that has a breakdown voltage higher than that of the first transistor and a second interconnect that is connected to the second transistor and has a width greater than that of the first interconnect in a plan view; and a dummy interconnect that is electrically isolated from both the first region and the second region, wherein the dummy interconnect is not arranged within the range of a first distance ($d_1$) from the center of the first interconnect in the first region, the dummy interconnect is not arranged in the range of a second distance ($d_2$) from the center of the second interconnect in the second region, and $d_2 > d_1$ is satisfied.

According to the above-mentioned embodiments of the invention, in the second region including the second transistor having a high breakdown voltage and the second interconnect having a large interconnect width, the dummy interconnect is not arranged adjacent to the second interconnect. In this way, even in the high breakdown voltage transistor having a large interconnect width and a large amount of current flowing therethrough, it is possible to prevent a high electric field from being applied to the insulating film through the dummy interconnect and maintain the reliability of the insulating film between the interconnects. Therefore, it is possible to prevent the occurrence of a short circuit between the interconnects and thus achieve an embedded device with high reliability.

According to the above-mentioned embodiments of the invention, in a semiconductor device including two transistors with different interconnect widths, it is possible to prevent the occurrence of a short circuit between the interconnects through a dummy interconnect and thus achieve an embedded device with high reliability.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
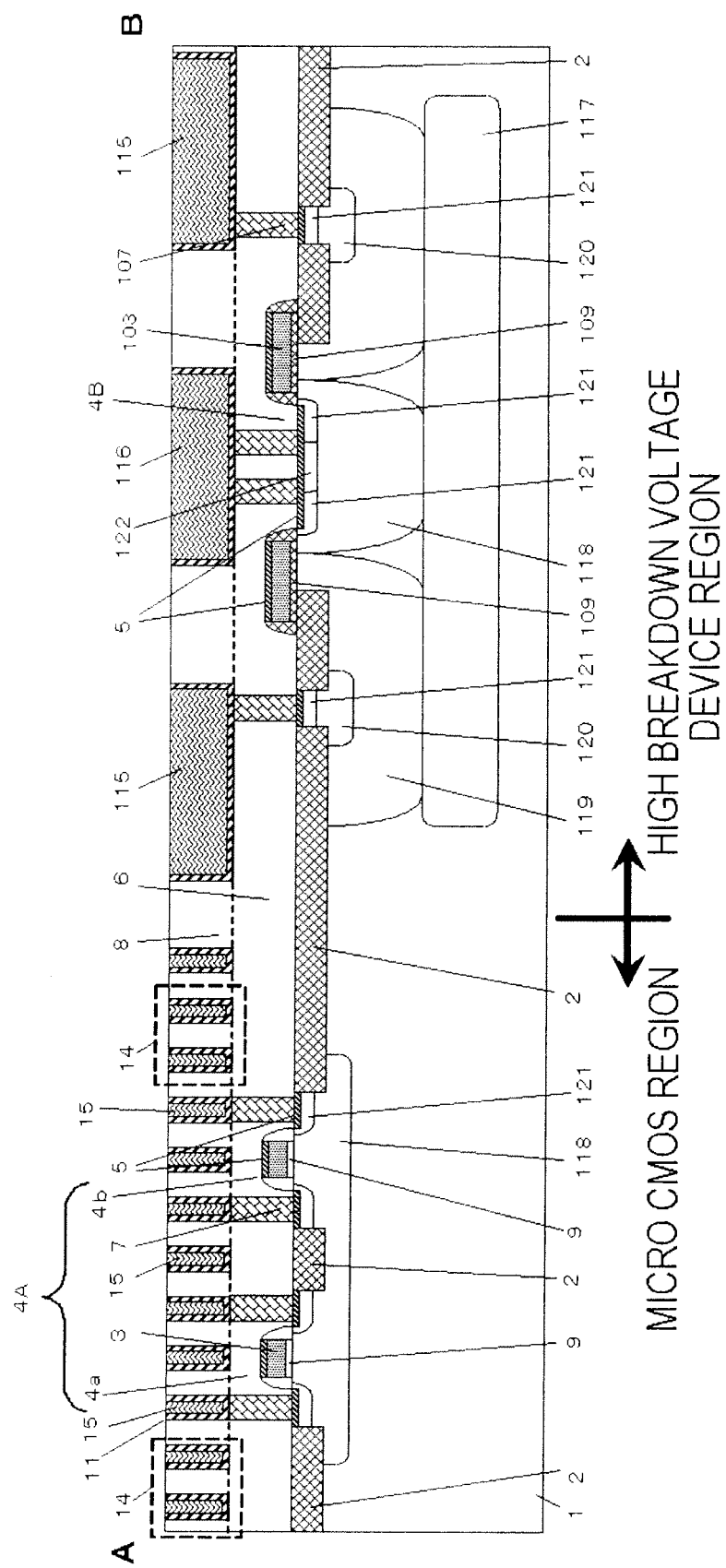
FIG. 1 is a cross-sectional view schematically illustrating an example of a semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In all of the drawings, the same components are denoted by the same reference numerals and a description thereof will not be repeated.

Figure 2:
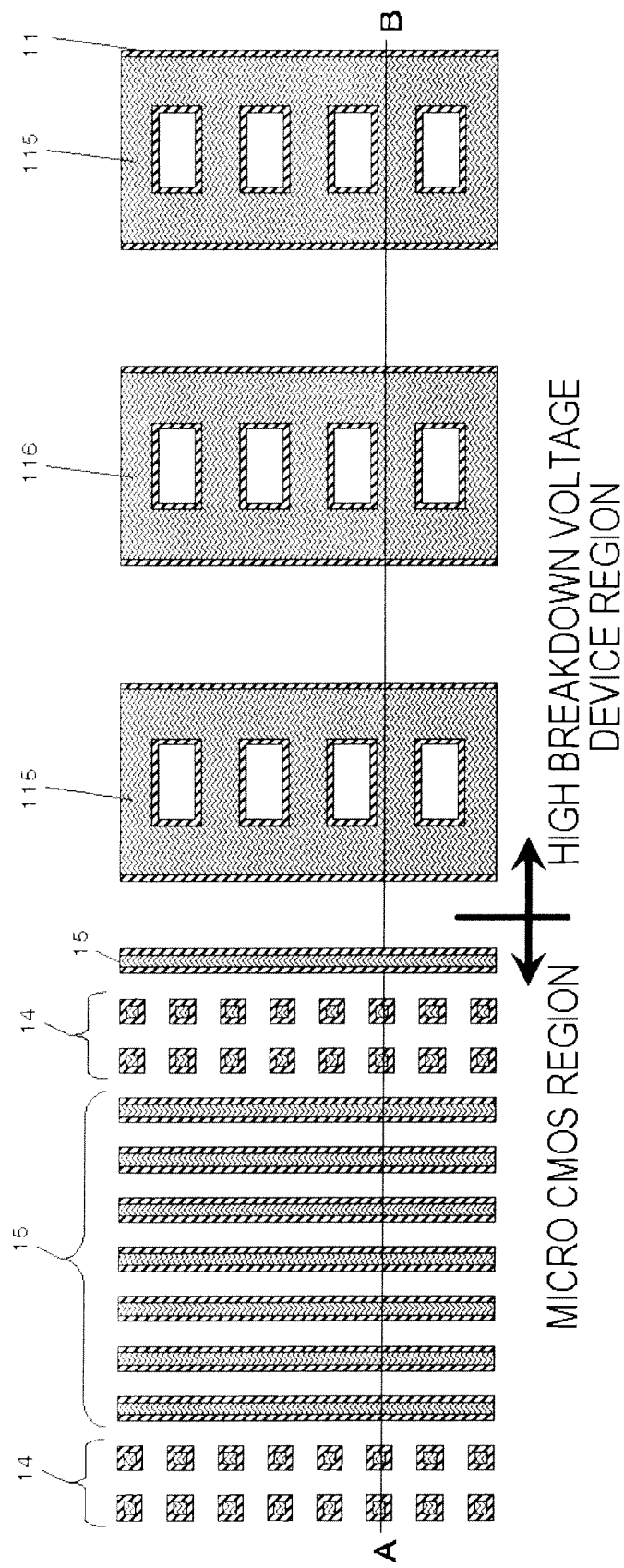
FIG. 2 is a plan view schematically illustrating an example of the semiconductor device according to the embodiment.

FIG. 1 is a cross-sectional view schematically illustrating a semiconductor device according to an embodiment. FIG. 2 is a plan view schematically illustrating the semiconductor device according to this embodiment. FIG. 1 is a cross-sectional view taken along the line A-B of FIG. 2. The semiconductor device according to this embodiment includes a silicon substrate 1 having a micro complementary metal oxide semiconductor (CMOS) region (first region) and a high breakdown voltage device region (second region) provided therein. A micro CMOS transistor (first transistor) 4A (hereinafter, referred to as a micro CMOS) is formed in the micro CMOS region. A high breakdown voltage device (second transistor) 4B having a breakdown voltage higher than that of the micro CMOS 4A is formed in the high breakdown voltage device region. Specifically, the high breakdown voltage device 4B has a drain breakdown voltage (or a collector breakdown voltage) or a gate breakdown voltage higher than that of the micro CMOS 4A. The semiconductor device according to this embodiment includes a plurality of micro interconnects 15 that is electrically connected to the micro CMOS 4A, a drain interconnect 115 and a source interconnect 116 that are formed in the same layer as that in which the micro interconnect 15 is formed and are electrically connected to the high breakdown voltage device 4B, and a dummy interconnect 14 that is not electrically connected to either of the micro CMOS 4A and the high breakdown voltage device 4B. The dummy interconnect 14 is electrically isolated from other interconnects and is not electrically connected to other interconnects. The dummy interconnect 14 is arranged adjacent to the micro interconnect 15 in the micro CMOS region. The dummy interconnect 14 may be formed between the micro interconnects 15. In the high breakdown voltage device region, the dummy interconnect 14 is not arranged adjacent to the drain interconnect 115 or the source interconnect 116. The width of the drain interconnect 115 and the source interconnect 116 is more than that of the micro interconnect 15 in a plan view. It is preferable that the minimum width of each of the drain interconnect 115 and the source interconnect 116 be more than the maximum width of the micro interconnect 15 in the micro CMOS region. In addition, the voltage applied between the drain interconnect 115 and the source interconnect 116 is higher than 5 V and is higher than the voltage (5 V or lower) applied between the micro interconnects 15.

Specifically, the micro CMOS 4A includes an NMOS 4a and a PMOS 4b. A metal oxide semiconductor (MOS) transistor having an operation voltage of 5.0 V or lower may be used as the micro CMOS 4A. For example, the micro CMOS 4A may be operated at a voltage of 5.0 V, 3.3 V, 2.5 V, 1.8 V, 1.5 V, 1.2 V, or 1.0 V. A gate insulating film 9 of the micro CMOS 4A may have a thickness of, for example, 20 nm (200 Å) or less.

A transistor having an operating voltage of higher than 5.0 V and a drain breakdown voltage (drain-source breakdown voltage) of more than 5.0 V, such as a double-diffused MOS (DMOS) or a laterally diffused MOS (LDMOS), may be used as the high breakdown voltage device 4B. A MOS transistor, in which the distance between the gate and the drain is greater than that in the micro CMOS 4A, may be used to increase the drain breakdown voltage. In addition, a transistor having an operating voltage of 5.0 V or higher and a collector breakdown voltage (a breakdown voltage between the emitter and the collector) of higher than 5.0 V, such as a bipolar transistor or an insulated gate bipolar transistor (IGBT), may be used as the high breakdown voltage device. Furthermore, the high breakdown voltage device may be a MOS transistor in which the thickness of a gate insulating film 109 is greater than that of the gate insulating film 9 in the micro CMOS 4A in order to increase the gate breakdown voltage.

The cross-sectional view of the semiconductor device according to this embodiment shown in FIG. 1 will be described in detail below.

An element isolation region 2, which is a trench, is formed in the micro CMOS region. The MOS transistor 4A having a gate electrode made of polysilicon 3 is formed on the P-type silicon substrate 1. The gate insulating film 9 is formed between the silicon substrate 1 and the polysilicon 3. A silicide layer 5 made of a metal material, such as titanium, is formed on the source and drain regions and the gate electrode of the MOS transistor 4A. A silicon oxide film 6 is formed on the silicide layer 5. A contact plug 7 is formed in a necessary portion of the silicon oxide film 6. An insulating interlayer 8 is formed on the silicon oxide film 6. A barrier film 11 made of titanium nitride, and the micro interconnect 15 and the dummy interconnect 14 made of a metal material are formed in a necessary portion of the insulating interlayer 8.

In the high breakdown voltage device region, an N-type well (NW) 117 is formed in the P-type silicon substrate 1. For example, a deep N-type well region, which is called a deep N-well (DNW), may be used as the NW 117. A body region, which is called a PW 118, of an LDMOS and a drain region including a drift region 119, an NW 120, and an N+ diffusion layer 121 are formed on the NW 117. The element isolation region 2 and the gate insulating film 109 are formed on the surface of the P-type silicon substrate 1 and a gate electrode made of polysilicon 103 is formed on the gate insulating film 109. An N+ diffusion layer 121 and a P+ diffusion layer 122 are connected to a source electrode 116 through the silicide layer 5 and a contact plug 107. The contact plug 107 is formed in the silicon oxide film 6 and the insulating interlayer 8 is formed on the silicon oxide film 6. The barrier film 11 made of titanium nitride and the drain and source interconnects 115 and 116 made of a metal material are formed in the insulating interlayer 8.

As shown in FIG. 1, the micro CMOS region and the high breakdown voltage device region are bonded to each other by the silicon oxide film 6 and the insulating interlayer 8. The micro interconnect 15, the dummy interconnect 14, the drain interconnect 115, and the source interconnect 116 are buried in the same insulating interlayer 8.

The micro interconnect 15, the drain interconnect 115, and the source interconnect 116 may be made of a metal material, such as copper (Cu), aluminum (Al), or tungsten (W). It is preferable that the interconnects be made of Cu or a Cu alloy having Cu as a main component. Since Cu has a specific resistance (about 60%) less than that of Al, the use of Cu makes it possible to reduce the cross-sectional area of the interconnect required to make the same amount of current flow with the same loss. In addition, the use of Cu makes it possible to increase electromigration resistance, as compared to Al.

In the micro CMOS region, the dummy interconnect 14 is formed adjacent to at least one micro interconnect 15. The term "adjacent" means that no pattern is formed between the micro interconnect 15 and the dummy interconnect 14. The term "adjacent" does not include "contact". The sentence "dummy interconnect 14 is formed adjacent to the micro interconnect 15" means that an interconnect (including the micro interconnect 15 and the dummy interconnect 14) is not arranged between the micro interconnect 15 and the dummy interconnect 14. The dummy interconnect 14 may be arranged between the micro interconnects 15. As shown in FIG. 2, it is preferable that the dummy interconnect 14 have a rectangular shape in a plan view, the gap between the interconnects be in the range from the minimum pitch determined by the process design rule to a value that is 1.5 times more than the minimum pitch, and the length of the interconnect in the longitudinal direction be two to three times more than the minimum width of the interconnect. For example, when the pitch between the micro interconnects 15 is 0.5 µm, the dummy interconnect 14 is about 0.25 µm×0.5 µm. As described above, the dummy interconnect 14 is not electrically connected to other interconnects, such as the micro interconnect 15, the drain interconnect 115, and the source interconnect 116, the micro CMOS 4A, or the high breakdown voltage device 4B, but is electrically isolated therefrom.

As described above, in the high breakdown voltage device region, the dummy interconnect 14 is not arranged between the drain interconnect 115 and the source interconnect 116. Since the dummy interconnect 14 is not arranged adjacent to the drain interconnect 115 or the source interconnect 116, it is possible to prevent a high electric field from being applied to the insulating film through the dummy interconnect 14 and thus prevent a leakage current from flowing to the insulating film. That is, when the dummy interconnect 14 is arranged adjacent to the drain interconnect 115 or the source interconnect 116, a high electric field is applied to the insulating film between the dummy interconnect 14 and the interconnects (115 and 116) since the gap between the dummy interconnect 14 and the interconnects (115 and 116) is small. As a result, a leakage path is formed in the insulating film and the drain interconnect 115 is short-circuited to the source interconnect 116 through the dummy interconnect 14.

In the high breakdown voltage device region, when the dummy interconnect 14 is not arranged, it is possible to completely prevent a short circuit due to the dummy interconnect 14, which is preferable.

Since the width of each of the drain interconnect 115 and the source interconnect 116 is more than that of the micro interconnect 15 in the micro CMOS region, a large amount of current flows to the high breakdown voltage device and the occupancy of the interconnects (interconnect data rate) increases. Therefore, it is not necessary to provide the dummy interconnect 14.

The gap between the drain interconnect 115 and the source interconnect 116 is designed such that a constant distance can be ensured therebetween according to a voltage difference between the interconnects. For example, when there is a voltage difference of 70 V between the interconnects, it is preferable that the gap between the drain interconnect 115 and the source interconnect 116 be equal to or more than 2.5 µm. In general, chip shrink is performed in order to reduce a cost. Therefore, the gap between the interconnects is set to the minimum value. However, when a sufficient gap can be ensured between the interconnects, the dummy interconnect 14 may be formed between the drain interconnect 115 and the source interconnect 116. For example, when there is a voltage difference of 70 V between the drain interconnect 115 and the source interconnect 116, the dummy interconnects may be formed at a pitch of 2.5 µm or more between the drain interconnect 115 and the source interconnect 116. In this case, it is possible to maintain reliability between the interconnects. When the dummy interconnect is arranged in the high breakdown voltage device region, for example, the maximum value of the distance between the center of the drain interconnect 115 or the source interconnect 116 and the center of the dummy interconnect in the high breakdown voltage device region may be more than the maximum value of the distance between the center of the micro interconnect 15 and the center of the dummy interconnect 14 in the micro CMOS region. In other words, the semiconductor device according to this embodiment may have a structure in which the dummy interconnect 14 is not arranged in the range of a first distance ($d_1$) from the micro interconnect 15 in the micro CMOS region, the dummy interconnect is not formed in the range of a second distance ($d_2$) from the drain interconnect 115 or the source interconnect 116 in the high breakdown voltage device region, and $d_2 > d_1$ is satisfied. In addition, the dummy interconnect 14 formed in the micro CMOS region and the dummy interconnect formed in the high breakdown voltage device region may have the same shape and size.

There is a case in which the drain interconnect 115 is adjacent to the gate interconnect (not shown) in the high breakdown voltage device region and a voltage difference of more than 5 V occurs therebetween. In this case, the dummy interconnect 14 is not formed between the drain interconnect 115 and the gate interconnect. The width of the gate interconnect may be equal to that of the drain interconnect 115 and the source interconnect 116.

In order to construct an electric circuit in the high breakdown voltage device region, it is possible to form passive elements including, for example, diodes serving as protective elements, resistors, such as a poly resistor and a metal resistor, capacitors, and inductors, in addition to the high breakdown voltage device, such as LDMOS. For the interconnects extending from these elements, the dummy interconnect 14 is not formed between adjacent interconnects having a voltage difference of 5 V or more therebetween. The width of the interconnects having a large voltage difference therebetween may be equal to that of the drain interconnect 115 and the source interconnect 116. When a large amount of current does not need to flow, the width of the interconnect in the high breakdown voltage device region may be equal to that of the micro interconnect 15 in the micro CMOS region. The interconnect pattern may have a strip shape in a plan view.

As described above, the width of each of the drain interconnect 115 and the source interconnect 116 is more than that of the micro interconnect 15. In this way, it is possible to make a large amount of current which is indispensable for the high breakdown voltage device flow to the interconnect while preventing an increase in the resistance of the interconnect. When the width of the interconnect increases, dishing is likely to occur in the vicinity of the center of the interconnect due to chemical mechanical polishing (CMP). Therefore, it is preferable that opening portions be formed in the surface of the drain interconnect 115 and the source interconnect 116. Specifically, it is preferable that the planar shape of the interconnect has a strip shape or a shape having opening portions, such as a ladder shape or a mesh shape, in a plan view in the high breakdown voltage device region. FIG. 2 shows an example in which a plurality of opening portions is formed in the surface of the interconnect and a pattern having a ladder shape in a plan view is formed on the surface of the interconnect.

Figure 3:
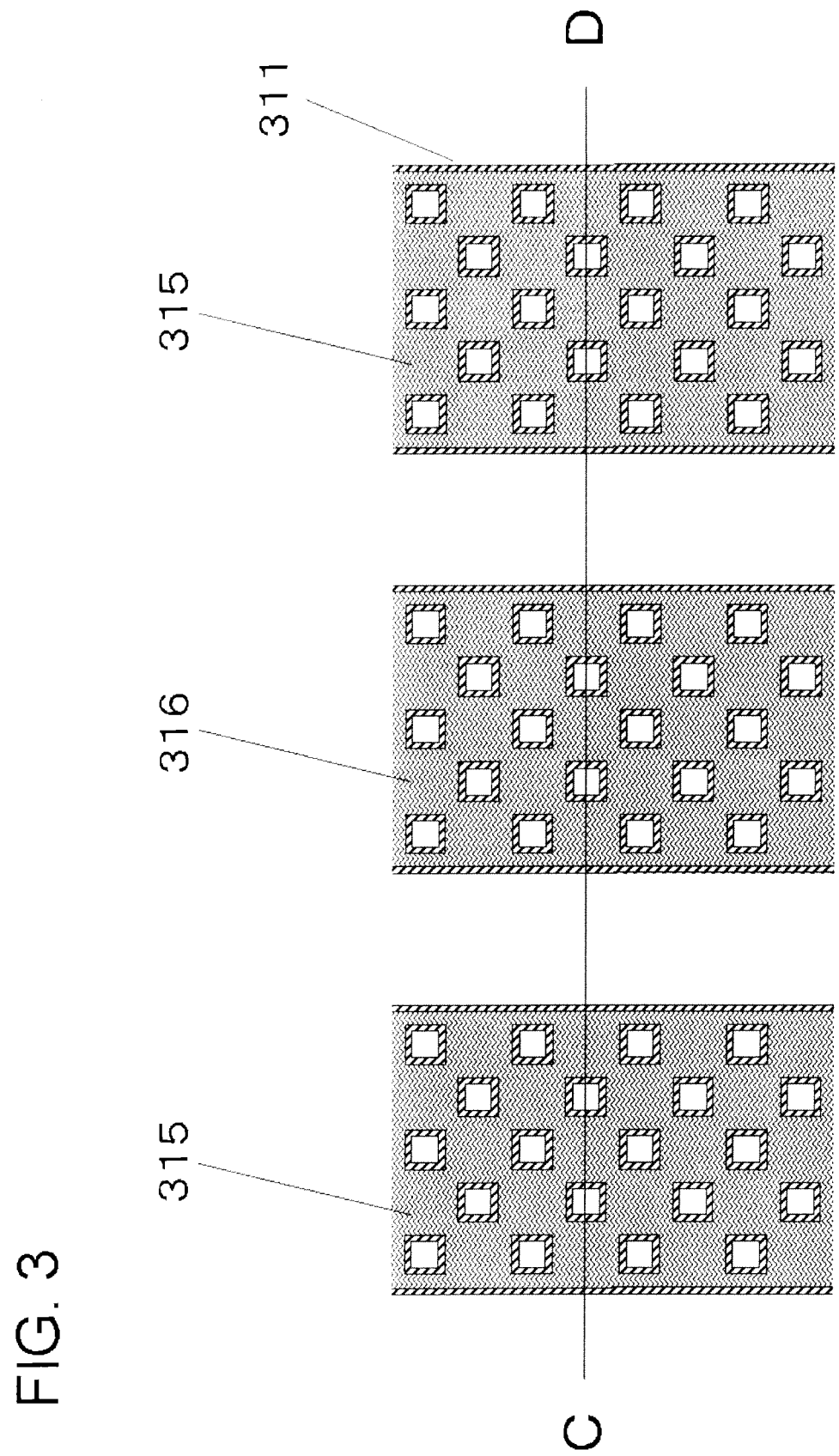
FIG. 3 is a plan view schematically illustrating an example of the semiconductor device according to the embodiment.
Figure 4:
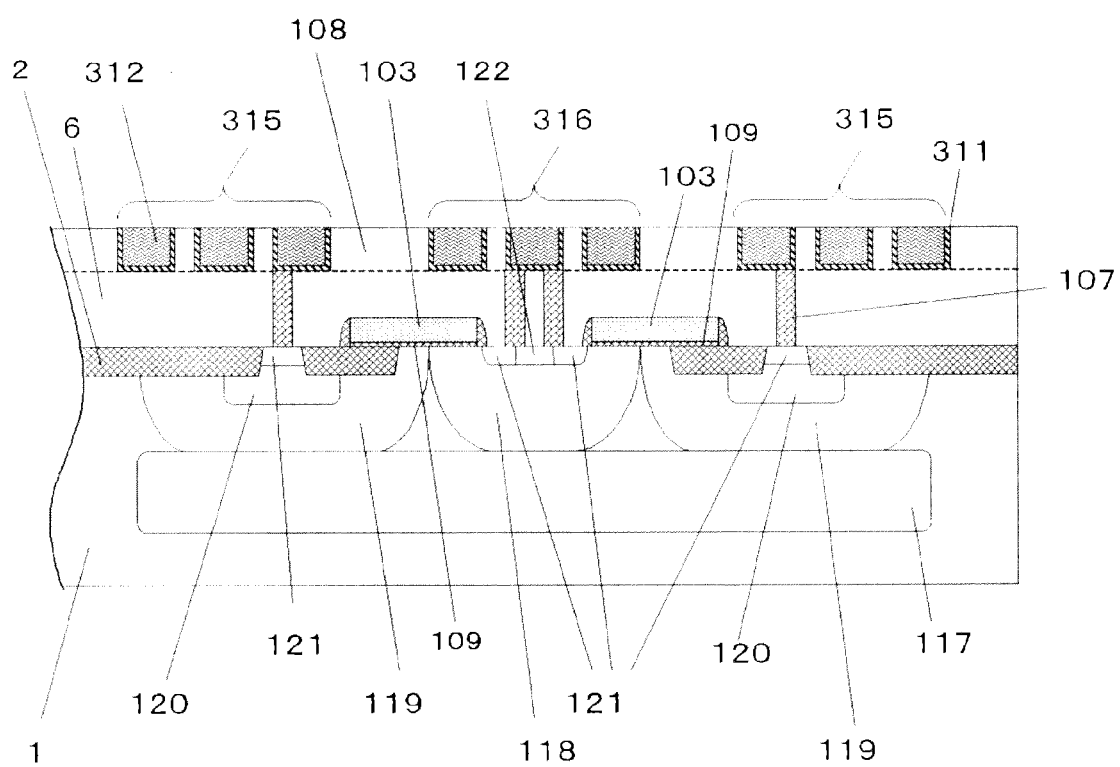
FIG. 4 is a cross-sectional view schematically illustrating an example of the semiconductor device according to the embodiment.

FIG. 3 shows an example in which a plurality of opening portions is formed in the surface of the interconnect and a pattern having a mesh shape in a plan view is formed on the surface of the interconnect. FIG. 4 is a cross-sectional view schematically illustrating the high breakdown voltage device region in which a mesh-shaped drain interconnect 315 and a mesh-shaped source interconnect 316 are formed. FIG. 4 is a cross-sectional view taken along the line C-D of FIG. 3. FIGS. 3 and 4 show only the high breakdown voltage device region, but do not show the micro CMOS region. In the examples shown in FIGS. 3 and 4, the dummy interconnect 14 is not arranged adjacent to and between the drain interconnect 315 and the source interconnect 316.

In the high breakdown voltage device region shown in FIG. 4, a barrier film 311 made of titanium nitride and drain and source interconnects 315 and 316 made of metal material 312 are formed in a necessary portion of an insulating interlayer 108. The other structures are the same as those in the high breakdown voltage device region shown in FIG. 1.

As such, since the planer shape of the drain interconnect 315 and the source interconnect 316 are arranged in a ladder shape or a mesh shape in a plan view in the high breakdown voltage device region, it is possible to ensure an effective interconnect width. Since the opening portions are formed in the drain interconnect 315 and the source interconnect 316, it is possible to optimize the density of the interconnect pattern and the distance between the interconnects. Therefore, it is possible to achieve the distance between the interconnects capable of ensuring the reliability of the insulating film between the interconnects. It is possible to make a large amount of current flow to the interconnect in the high breakdown voltage device region while maintaining the reliability of the interconnect.

In addition, since the opening portions are formed in the drain interconnect 315 and the source interconnect 316, it is possible to reduce the interconnect data rate, as compared to a case in which the opening portion is not provided. Therefore, even when the width of the drain interconnect 315 and the source interconnect 316 is large and the interconnect data rate (the density of the interconnects) is higher than that in the micro CMOS region, the opening portions formed in the drain interconnect 315 and the source interconnect 316 make it possible to make the interconnect data rate close to that in the micro CMOS region. Therefore, it is possible to prevent the occurrence of dishing or erosion in the CMP process or a variation in the width of the interconnect formed by a lithography process (from a designed interconnect width).

The width of the interconnect or the area of the opening portion in a plan view may be optimized such that the interconnect data rate is preferably in the range of 10% to 80%. In this way, it is possible to reduce the occurrence of dishing or erosion.

Figure 5:
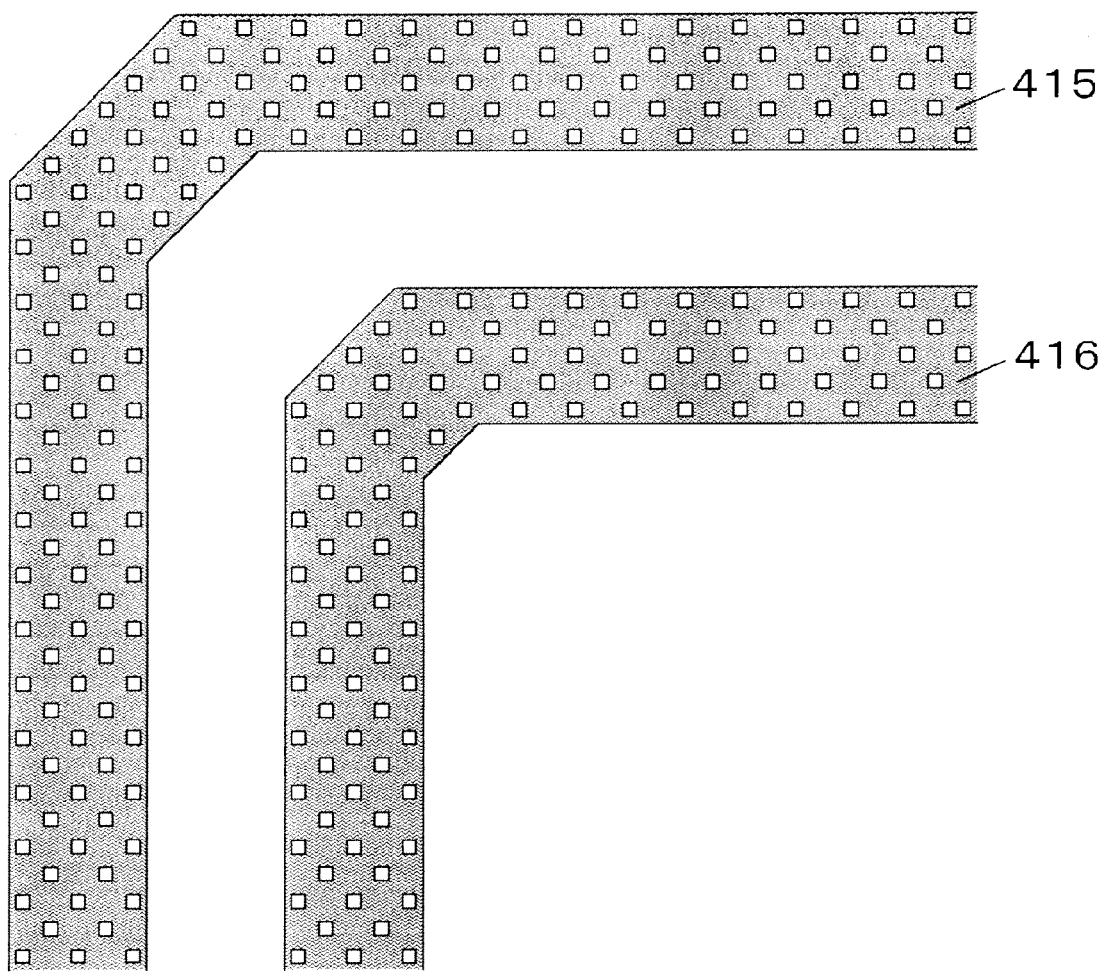
FIG. 5 is a plan view schematically illustrating an example of the semiconductor device according to the embodiment.
Figure 6:
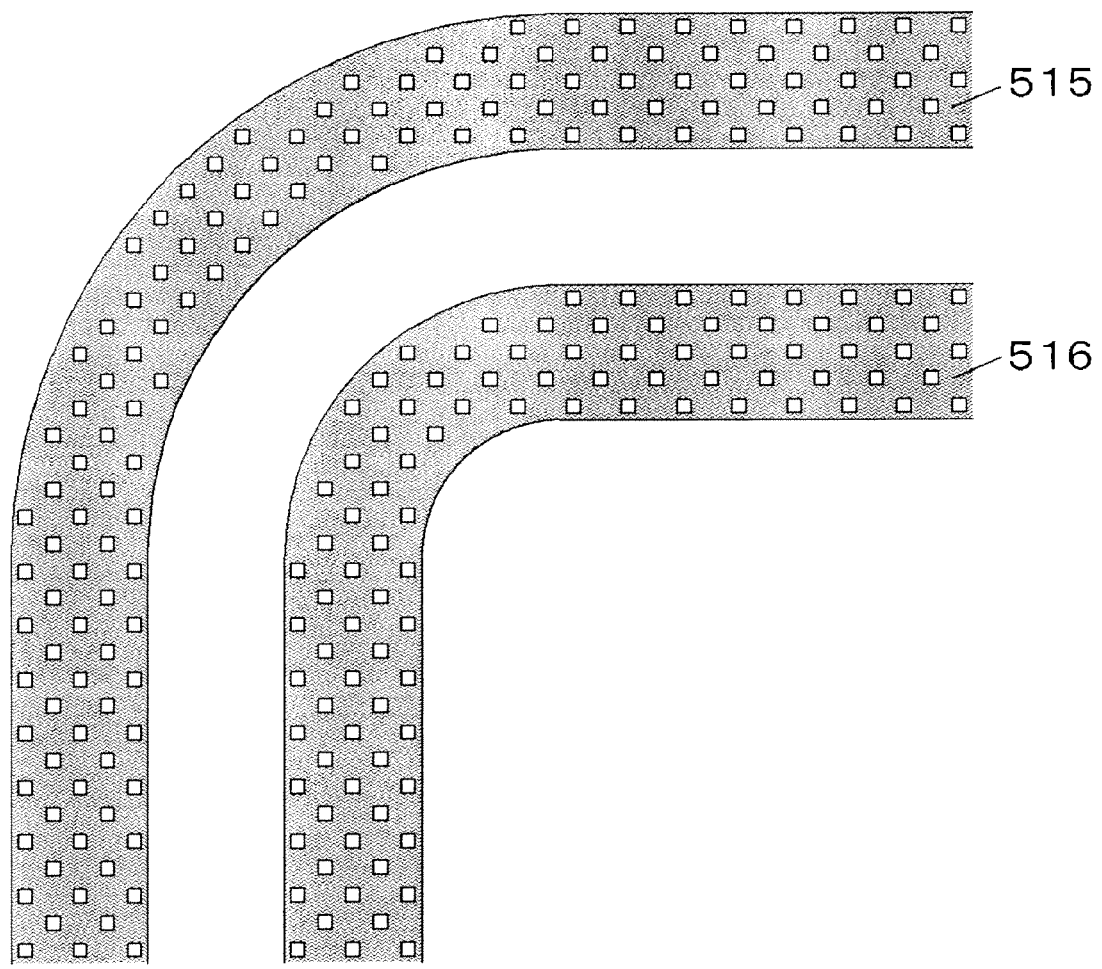
FIG. 6 is a plan view schematically illustrating an example of the semiconductor device according to the embodiment.
Figure 7:
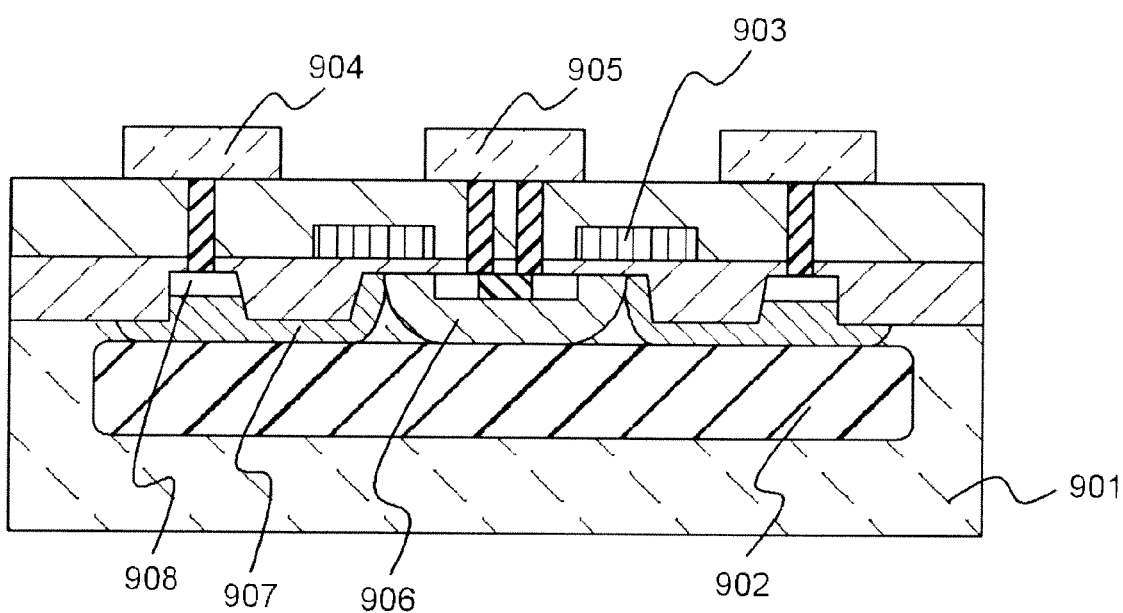
FIG. 7 is a cross-sectional view schematically illustrating an example of a semiconductor device according to the related art.
Figure 8:
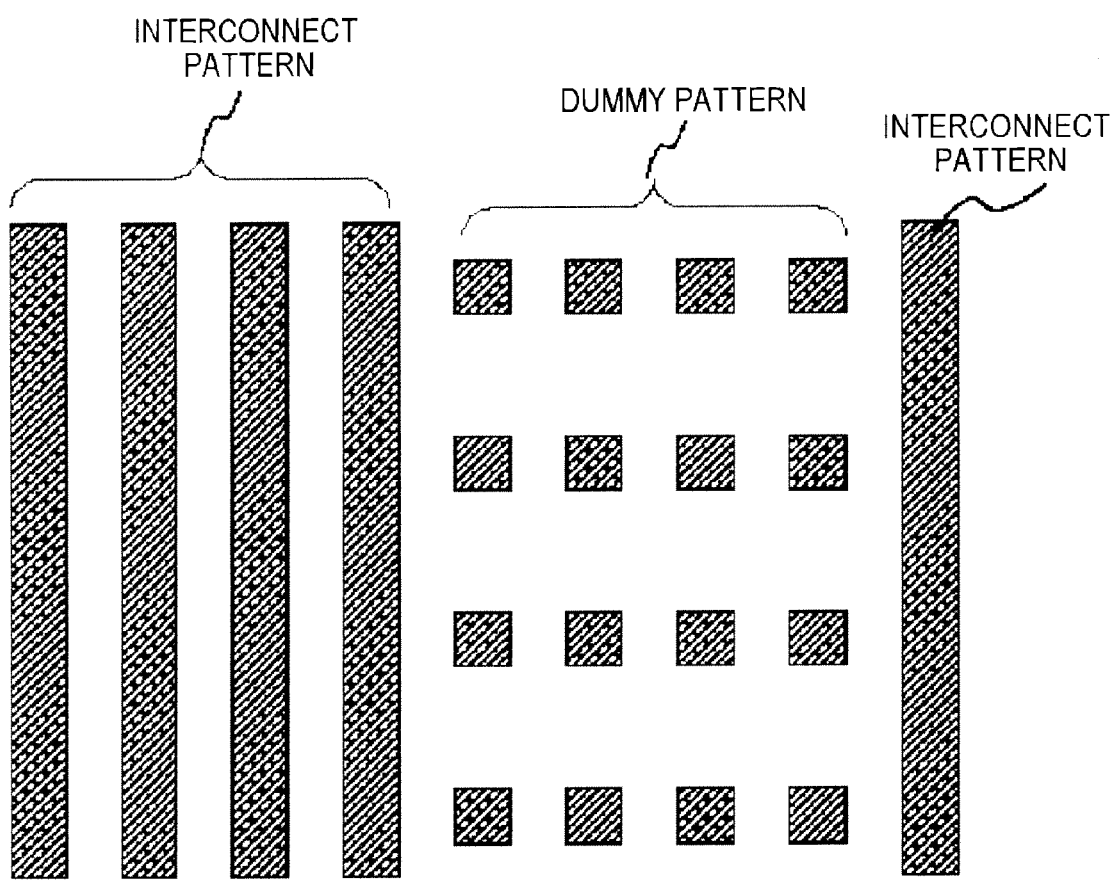
FIG. 8 is a plan view schematically illustrating an example of the semiconductor device according to the related art.

However, when the drain interconnect 115 and the source interconnect 116 are formed so as to be bent at a right angle in a plan view, an electric field is likely to be concentrated on the bent portion, which results in a significant reduction in the reliability between the interconnects. Therefore, interconnect patterns shown in FIGS. 5 and 6 may be used to prevent the reduction in the reliability between the interconnects. Specifically, FIG. 5 shows an interconnect pattern in which a portion that is bent at a right angle is chamfered in a plan view. FIG. 6 shows an interconnect pattern in which a portion that is bent at a right angle has a substantially arc shape in a plan view. When there is a voltage difference of about 60 V between a drain interconnect 415 and a source interconnect 416, it is preferable to use the interconnect pattern shown in FIG. 5. When there is a voltage difference of 60 V or more between a drain interconnect 515 and a source interconnect 516, it is preferable to use the interconnect pattern shown in FIG. 6.

For ease of understanding, in FIGS. 5 and 6, the barrier layer shown in, for example, FIGS. 2 and 3 is not shown. In FIGS. 5 and 6, a mesh-shaped interconnect pattern is given as an example. However, in a ladder-shaped interconnect pattern, similarly, a bent portion is chamfered or is formed in a substantial arc shape. In the description with reference to FIG. 6, the term "substantially arc shape" is used for the following reason. Since EB drawing using a laser beam is used to create chrome data on a mask, it is difficult to form a complete arc shape using the chrome data and the pattern is formed in a step shape in practice. However, it is preferable that the pattern be formed in a complete arc shape if that is possible.

Next, as an example of a method of manufacturing the semiconductor device according to this embodiment, a method of manufacturing the semiconductor device having the structure shown in FIG. 1 will be described.

First, the element isolation region 2 is formed in the P-type silicon substrate 1 using a trench. Then, impurities are implanted into the high breakdown voltage device region to form the NW 117, such as a DNW. Then, impurity ions, such as boron ions or arsenic ions, are implanted to form, for example, the drift region 119 (N-type well) and the body region 118 (P-type well). Then, the gate insulating films 9 and 109 are formed and then the gate electrodes are formed of the polysilicon materials 3 and 103. The micro CMOS 4A is formed in the micro CMOS region and the high breakdown voltage device 4B is formed in the high breakdown voltage device region. In order to reduce connection resistance to, for example, the contact plugs 7 and 107 in the subsequent process, a metal film, such as a titanium film, is formed on the source and drain regions and the gate electrodes of the MOS transistors 4A and 4B and is silicided to form the silicide layer 5. Then, the silicon oxide film 6 is formed with a thickness of 800 nm to 1 µm. Then, for example, etching and CMP are performed to planarize the silicon oxide film 6 and contact holes are formed in the silicon oxide film 6 by a general photolithography process and a general dry etching process. Then, a barrier layer, such as a titanium film or a titanium nitride film, and the contact plugs 7 and 107 made of tungsten are formed.

Then, the insulating interlayer 8 is formed with a thickness of 400 nm to 600 nm by a plasma CVD method. The insulating interlayer 8 may be made of, for example, $SiO_2$, SiOCN, or SiOC. In addition, a general low-permittivity film (a film with a permittivity less than that of the silicon oxide film) may be formed as the insulating interlayer 8. Then, a photoresist is patterned by photolithography. At that time, patterning is performed only in the micro CMOS region such that the dummy interconnect 14 can be arranged around the micro interconnect 15 in an isolated interconnect portion in which there is no interconnect.

Then, trenches for forming the micro interconnect 15, the dummy interconnect 14, the drain interconnect 115, and the source interconnect 116 are formed in the insulating interlayer 8 by, for example, a reactive ion etching (RIE) method using gas, such as $C_4F_8$ or $CHF_3$.

Then, the barrier film 11 is formed in the trench by the existing technique and is covered with a metal material including copper.

Finally, an unnecessary portion of the metal material and the barrier film 11 is removed by a CMP method to form the micro interconnect 15, the dummy interconnect 14, the drain interconnect 115, and the source interconnect 116. Then, an arbitrary process is performed to complete the semiconductor device.

Next, the effect of this embodiment will be described with reference to FIG. 1. According to the semiconductor device of this embodiment, the dummy interconnect 14 is not formed between the drain interconnect 115 and the source interconnect 116 in the high breakdown voltage device region. Therefore, it is possible to ensure the distance between the drain interconnect 115 and the source interconnect 116 and thus maintain the reliability of the insulating film between the interconnects. As a result, it is possible to prevent the occurrence of a short circuit between the drain interconnect 115 and the source interconnect 116 and thus achieve a embedded device with high reliability.

Next, the effect of this embodiment will be described in detail. In recent years, in terms of a reduction in carbon-dioxide emissions, for example, a high breakdown voltage device which is called a power MOS has been frequently used in electronic apparatuses. This is because the high breakdown voltage device is used as a switch to reduce power loss, thereby reducing power consumption. For example, in the case of illumination using an LED, a high breakdown voltage device with a low on-resistance is used in order to reduce power loss due to AC/DC conversion. Finely modulated light is emitted to reduce power consumption. However, in this case, a logic circuit including a micro CMOS is needed. In order to reduce costs, it is preferable that both the high breakdown voltage device and the micro CMOS be mounted on the same chip.

However, the examination result of the inventor proved that, in the case of the semiconductor device embedding both the micro CMOS and the high breakdown voltage device, the following problems arose. In the micro CMOS region, in general, the dummy interconnects that are not connected to other interconnects are arranged at the minimum pitch of the design rule. The examination result of the inventor proved that, when the dummy interconnects 14 were arranged at the minimum pitch of the design rule in the high breakdown voltage device region and a high voltage was applied between the drain interconnect 115 and the source interconnect 116, it was difficult to ensure the reliability of the insulating interlayer 8 between the interconnects and the insulating interlayer 8 deteriorated significantly, resulting in the occurrence of a short circuit between the drain interconnect 115 and the source interconnect 116 through the dummy interconnect 14.

In general, it is preferable to increase the width of the interconnect in order to make a large amount of current flow while reducing Joule heat loss caused by the resistance of the interconnect as much as possible. However, when only the width of the interconnect in the high breakdown voltage device region increases in the semiconductor device embedding both the micro CMOS and the high breakdown voltage device, the interconnects with small and large widths are embedded. Therefore, during a CMP process, so-called dishing in which the surface of a central portion of the trench interconnect formed in a wide trench is lower than the surface of a peripheral portion thereof occurs, which has an adverse effect on a planarizing process or wire bonding in an assembly process subsequent to the CMP process. Therefore, when a large amount of current flows in the high breakdown voltage device region, it is difficult to easily increase the width of the interconnect.

However, in this embodiment, in the semiconductor device including both the micro CMOS 4A and the high breakdown voltage device, the dummy interconnect 14 is arranged in the micro CMOS region, but no dummy interconnect is arranged between the drain interconnect 115 and the source interconnect 116 in the high breakdown voltage device region. In this way, it is possible to prevent a short circuit between the drain interconnect 115 and the source interconnect 116 of the high breakdown voltage device.

In addition, the opening portions formed in the surface of the interconnect such as a ladder shape or a mesh shape as the planar layout of the interconnect in the high breakdown voltage device region make it possible to effectively achieve an interconnect with a large width. As a result, it is possible to make a large amount of current which is indispensable for the high breakdown voltage device flow while preventing an increase in the resistance of the interconnect and maintaining the reliability of the interconnect.

The high breakdown voltage device needs to have a high breakdown voltage in an off state and a low resistance in an on state, and a large amount of current needs to flow to the transistor and the interconnect. When the interconnect is made of Cu, it is possible to reduce the cross-sectional area of the interconnect and reduce electromigration.

The embodiment of the invention has been described above with reference to the drawings, but the invention is not limited thereto. The above-described embodiment is illustrative, and various kinds of structures other than the above may be used. For example, in the embodiment, the dummy interconnect is not formed in the high breakdown voltage device region. However, as described in the embodiment, the inventor found that, when a voltage difference of 70 V occurred between the interconnects in the high breakdown voltage device region, it was possible to maintain the reliability between the interconnects by setting the gap between the interconnects to be equal to or more than 2.5 µm. Therefore, it is considered that, when the gap between the dummy interconnect and an adjacent interconnect can be set to 2.5 µm or more, it is possible to ensure the reliability between the interconnects even though the dummy interconnect is formed in the high breakdown voltage device region. In the micro CMOS region, the dummy interconnect is arranged such that the gap between the dummy interconnect and an adjacent interconnect is 0.5 µm. Therefore, it is possible to maintain the reliability between the interconnects by setting the density of the dummy interconnects in the high breakdown voltage device region to be less than that of the dummy interconnects between the interconnects in the micro CMOS region.

It is apparent that the present invention is not limited to the above embodiment, and may be modified and changed without departing from the scope and spirit of the invention.

What is claimed is:

1. A semiconductor device comprising:
a first region including a first transistor and a first interconnect that is connected to the first transistor; and
a second region including a second transistor that has a breakdown voltage higher than that of the first transistor and a second interconnect that is connected to the second transistor and has a width greater than that of the first interconnect in a plan view,
wherein an electrically-isolated dummy interconnect is not provided adjacent to at least the second interconnect in the second region,
wherein the electrically-isolated dummy interconnect is provided in the first region,
wherein the electrically-isolated dummy interconnect is not electrically connected to the first transistor.

2. The semiconductor device according to claim 1, wherein the dummy interconnect is arranged adjacent to the first interconnect in the first region.

3. The semiconductor device according to claim 1, wherein the dummy interconnect is not arranged in the second region.

4. The semiconductor device according to claim 1, wherein the second transistor has a drain breakdown voltage higher than that of the first transistor.

5. The semiconductor device according to claim 4, wherein the first transistor is a MOS transistor, and the second transistor is a double-diffused MOS transistor or a laterally diffused MOS transistor.

6. The semiconductor device according to claim 1, wherein the second transistor has a gate breakdown voltage higher than that of the first transistor.

7. The semiconductor device according to claim 6, wherein the first transistor is a MOS transistor, and the second transistor is a MOS transistor having a gate insulating film thicker than a gate insulating film of the first transistor.

8. The semiconductor device according to claim 1, wherein a plurality of the first interconnects is provided, and
one dummy interconnect or a plurality of dummy interconnects is arranged between the first connects in the first region.

9. The semiconductor device according to claim 1, wherein a plurality of the first interconnects and a plurality of the second interconnects are provided, and
a voltage applied between the second interconnects is higher than that applied between the first interconnects.

10. The semiconductor device according to claim 1, wherein an opening portion is formed in the surface of the second interconnect.

11. The semiconductor device according to claim 10, wherein a plurality of the opening portions is formed in the surface of the second interconnect, and
a ladder-shaped pattern is formed in the surface of the second interconnect in a plan view.

12. The semiconductor device according to claim 10, wherein a plurality of the opening portions is formed in the surface of the second interconnect, and
a mesh-shaped pattern is formed in the surface of the second interconnect in a plan view.

13. A semiconductor device comprising:
a first region including a first transistor and a first interconnect that is connected to the first transistor;
a second region including a second transistor that has a breakdown voltage higher than that of the first transistor and a second interconnect that is connected to the second transistor and has a width greater than that of the first interconnect in a plan view; and
a dummy interconnect that is electrically isolated from both the first region and the second region,
wherein the dummy interconnect not arranged within the range of a first distance ($d_1$) from the center of the first interconnect in the first region,
the dummy interconnect is not arranged in the range of a second distance ($d_2$) from the center of the second interconnect in the second region, and
$d_2 > d_1$ is satisfied,
wherein the dummy interconnect is not electrically connected to the first transistor or the second transistor.

* * * * *